United States Patent
Chen

(10) Patent No.: US 6,657,500 B1
(45) Date of Patent: Dec. 2, 2003

(54) METHOD AND SYSTEM OF CHARACTERIZATION AND BEHAVIORAL MODELING OF A PHASE-LOCKED LOOP FOR FAST MIXED SIGNAL SIMULATION

(75) Inventor: Pi-Cheng Chen, Hsin-chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 99 days.

(21) Appl. No.: 10/042,076

(22) Filed: Jan. 8, 2002

(51) Int. Cl.[7] .............................................. H03L 7/00
(52) U.S. Cl. ............................. 331/17; 331/34; 331/16; 331/117 R
(58) Field of Search ........................... 331/176, 177 R, 331/16, 17, 34, 1 A

(56) References Cited

U.S. PATENT DOCUMENTS

| | | | |
|---|---|---|---|
| 5,392,227 A | 2/1995 | Hiserote | 364/578 |
| 5,987,238 A | 11/1999 | Chen | 395/500.02 |
| 6,292,066 B1 * | 9/2001 | Shibuya et al. | 331/176 |

FOREIGN PATENT DOCUMENTS

JP          229009    *  1/1990

OTHER PUBLICATIONS

Smedt et al., "Models for Systematic Design and Verification of Frequency Synthesizers," IEEE Transactions on Circuit and Systems—II: Analog and Digital Signal Processing, vol. 46, No. 10, pp. 1301–1308, Oct. 1999, IEEE. Behagi et al. Piecewise linear modeling of solid–state varactor–tuned microwave oscillators, 46th Proceeding of the 1992 IEEE Frequency Contro, Symposium May 27–29, 1992, pp 415–419.*

* cited by examiner

Primary Examiner—Michael B Shingleton
(74) Attorney, Agent, or Firm—George O. Saile; Stephen B. Ackerman; Billy Knowles

(57) ABSTRACT

A piecewise linear phase locked loop frequency generator generates a voltage signal controlled by an input voltage. This frequency generator has a variable static frequency generator, whose frequency is selected by a control voltage and whose transfer function between control voltage and output frequency is further selected by a piecewise linear determination parameter. The piecewise linear determination parameter is the number which selects which portion of the frequency spectrum is being represented by the control voltage to frequency transfer function being selected and is a function of an input control voltage. The frequency generator has a set of n low pass filters, used to work in conjunction with the corresponding control voltage to provide frequency transfer functions which are selected by the piecewise linear determination parameter. Finally, a switch circuit is employed to select as a function of the piecewise linear determination parameter which low pass filter output should be presented as the dynamic frequency which corresponds to the original control voltage input. In addition, it is also an objective of this invention to provide a model of a phase locked loop to be simulated within a simulator to determine the function of a phase locked loop within an electronic system.

19 Claims, 8 Drawing Sheets

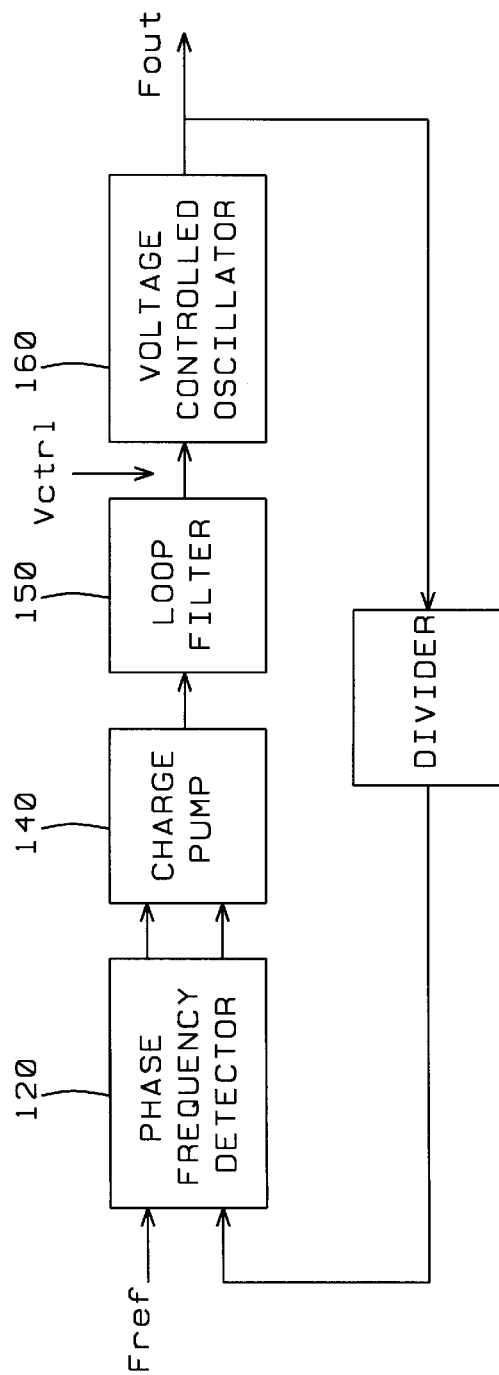
FIG. 1 - Prior Art
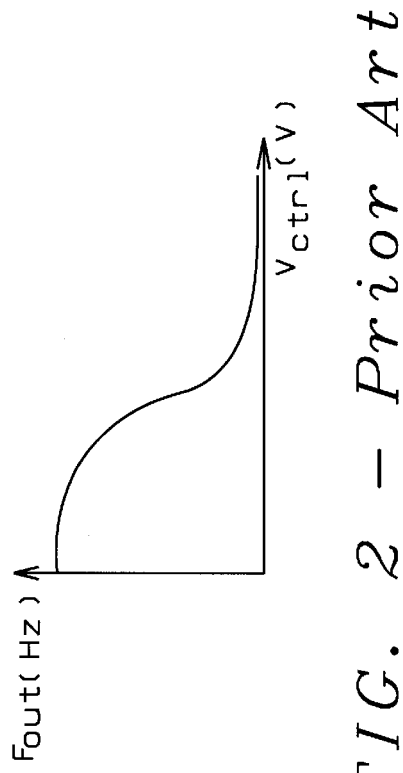
FIG. 2 - Prior Art

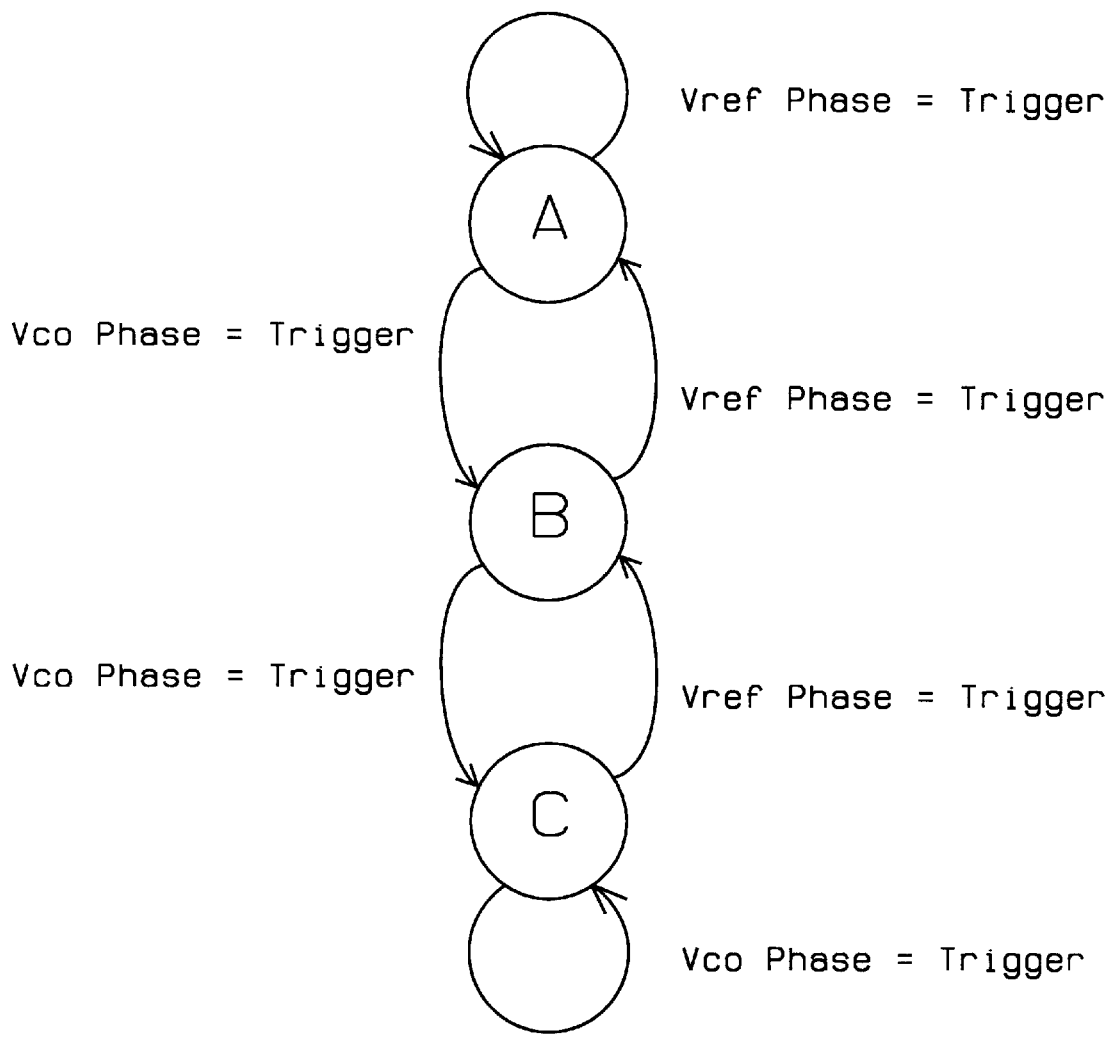
*FIG. 3a — Prior Art*
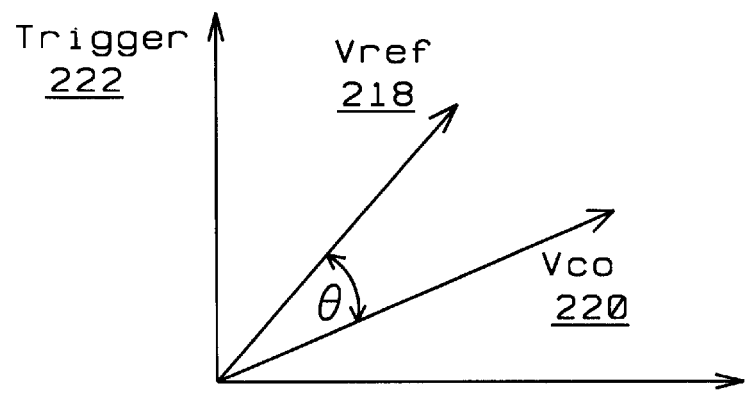
*FIG. 3b — Prior Art*

METHOD AND SYSTEM OF CHARACTERIZATION AND BEHAVIORAL MODELING OF A PHASE-LOCKED LOOP FOR FAST MIXED SIGNAL SIMULATION

BACKGROUND OF THE INVENTION

1. Field of the Invention

This invention relates to the formation of simplified representations of electronic circuits to model responses of the electronic circuits to input stimuli. More particularly this invention relates to the simplified representations of circuits such as phase-locked loops to efficiently predict the behavior of the circuits to input stimuli.

2. Description of Related Art

Today, there are new mixed-signal and multi-level simulation languages, which can accurately represent the analog portion of the mixed circuits with behavioral models. Behavioral models are "if-then-else" structured programs, which describe the analog circuit's behavior. The "if-then-else" structured program is based on the basis that an input signal to a known system will produce a predictable response signal. Thus, if a function for the input signal vs. output signal is derived, the behavior of the circuit can be predicted without having a full circuit or device level model. The function may be a simple table lookup of input signal levels with attendant response signal levels or a complex mathematical function having multiple parameters of the input signal necessary to derive the output response.

FIG. 1 shows a system diagram for a phase-locked loop (PLL). A PLL circuit causes a given system to track with another system. A PLL typically causes one electrical signal with a given frequency to track, follow, or become synchronized with another electrical signal. In FIG. 1, the PLL synchronizes a Voltage Controlled Oscillator (VCO 185) signal with a reference signal (Vref 180). The PLL synchronizes frequency as well as phase. When Vref and VCO are synchronized, the PLL is in a "locked" state. In this state, the phase error between VCO and Vref is zero or close to zero. If a finite phase error builds up, the PLL circuit in FIG. 1 uses a feedback control mechanism, which causes the phase error to approach, zero once again.

The phase frequency detector 120 compares the phase of VCO to Vref and produces an output signal, which is proportional to the phase error. This output signal has AC and DC components. In FIG. 1, the loop filter 150, which is usually a first-order low-pass filter, filters out the AC component. The voltage controlled oscillator (VCO) produces an output signal, which has a frequency, which is a function of the VCO input, which is the control voltage. FIG. 2 shows a standard VCO transfer function where the output signal frequency is plotted vs. the VCO input control voltage. The divider circuit 170 in FIG. 1 is an option, which is needed only when the VCO output frequency is a multiple N times greater than the frequency of Vref. In this case, the divider would be a Divide-by-N circuit. Similarly, the divider in FIG. 1 could be replaced by a multiplier if the VCO output frequency is a multiple N times less than the frequency of Vref. In order for the phase frequency detector 120 to work, the frequencies of Vref and VCO must be close to each other. The charge pump circuit 140 in FIG. 1 takes the up/down voltage output of the phase frequency detector 120 and outputs a proportional current which goes to the loop filter 150. A state diagram in FIG. 3a shows the three states of the phase frequency detector 120 and the three phase detector output voltage states which control the action of the charge pump circuit 140. The phase angle diagram in FIG. 3b shows two counterclockwise rotating vectors, which represent the VCO and Vref signals. The input control for the state diagram in FIG. 3a can be understood by following the two rotating vectors as they rotated past the trigger axis shown in FIG. 3b. This mechanism is the feedback control system, which causes the VCO signal to "lock on to", the Vref signal after several oscillation cycles via the charge pump current source/sink function of FIG. 3a. The speed of reaching the equilibrium state of "locking on to" the Vref signal by the VCO signal is a figure of merit of phase locked loops.

Simulation of the PLL blocks described consists of the following models. The phase frequency detector is modeled as a behavioral model with two inputs, VCO and Vref. The model determines the lead-lag relationship and the frequency/phase difference. It then delivers two signals to direct the charge pump circuitry to source current, sink current or turn the charge pump current off.

A state machine similar to FIG. 3a is included in the phase frequency detector model. The current and voltage values used in the behavioral model tables are obtained from simulation of computer aided circuit design models. The VCO 185 is modeled as a behavioral model. Circuit simulation provides the output frequency vs. control voltage transfer curve, such as in FIG. 5. The charge pump 140 is modeled with a behavioral where the relationship between the output voltage and pump current is modeled with tables, which were constructed from circuit analysis results. The divider 170 in FIG. 1 is basically a counter that outputs a clock signal whose frequency in the input clock divided or multiplied by a parameter, N. The voltage relationship between input and output signals is derived from circuit analysis and can be described with digital event-driven behavioral statements. Finally, the loop filter 150 in FIG. 1 is modeled as an RC low-pass network where each component is represented by an analytical I-V transfer function.

U.S. Pat. No. 5,392,227 (Hiserote) provides a system and a method for translating gate level design data into behavioral level simulation models that are accurate and have high simulation performance. It also provides accurate simulation models for complex integrated circuits prior to the availability of the circuits.

U.S. Pat. No. 5,987,238 (Chen) provides a method for making a phase-locked loop circuit. The method includes a method of simulating the phase-locked loop circuit.

Smedt et al., "Models for Systematic Design and Verification of Frequency Synthesizers," IEEE Transactions on Circuit and Systems—II: Analog and Digital Signal Processing, Vol. 46, No. 10, October 1999, IEEE, provides models for the design and verification of frequency synthesizers. It provides for insight into both the top-down high level design and the bottom-up low-level verification phase of frequency synthesizer development.

BRIEF SUMMARY OF THE INVENTION

It is an object of this invention to provide a piecewise linear phase locked loop frequency generator to generate a voltage signal controlled by an input voltage.

In addition, it is also an objective of this invention to provide a model of a phase locked loop to be simulated within a simulator to determine the function of a phase locked loop within an electronic system.

These and other objects of this invention are accomplished by a piecewise linear phase locked loop frequency generator. The piecewise linear phase locked loop frequency generator has a variable static frequency generator, whose frequency is selected by a control voltage and whose transfer function between control voltage and output frequency is further selected by a frequency selection parameter, n. This frequency selection parameter, n, designates the number, which identifies which portion of the frequency spectrum is being represented by the control voltage to frequency transfer function being selected. Second, a set of low pass filters is used to work in conjunction with the corresponding control voltage to output frequency transfer functions, which are selected by a frequency selection parameter, n. The number of low pass filters is equal to the frequency selection parameter n. Finally, a switch circuit is employed to select as a function of the frequency selection parameter, n, which low pass filter output should be presented as the dynamic frequency which corresponds to the original control voltage input.

The simulation model would use the behavioral model of a variable static frequency generator. The frequency of the variable static fuse generator is selected by a control voltage, a set of RC network models of n low pass filters, LPF1, LPF2, . . . LPFn, and a behavioral model of a selector switch which selects between the output of n low pass filters, LPF1, LPF2, . . . LPFn, using the same control voltage which was used to select the frequency in the variable static frequency generator.

A simulation model of a phase locked loop employs a function description of the piecewise linear phase locked loop frequency generator.

BRIEF DESCRIPTION OF THE DRAWINGS

FIG. 1 is a system diagram of the prior art of a phase locked loop.

FIG. 2 shows a plot of the frequency vs. control voltage transfer function graph of a voltage controlled oscillator (VCO) of the prior art.

FIG. 3a shows a state diagram of a phase frequency detector and how its output controls a charge pump circuit in a PLL of the prior art.

FIG. 3b shows a phase graph relationship between Vref and VCO signals of a PLL of the prior art.

DETAILED DESCRIPTION OF THE INVENTION

Figure 4:
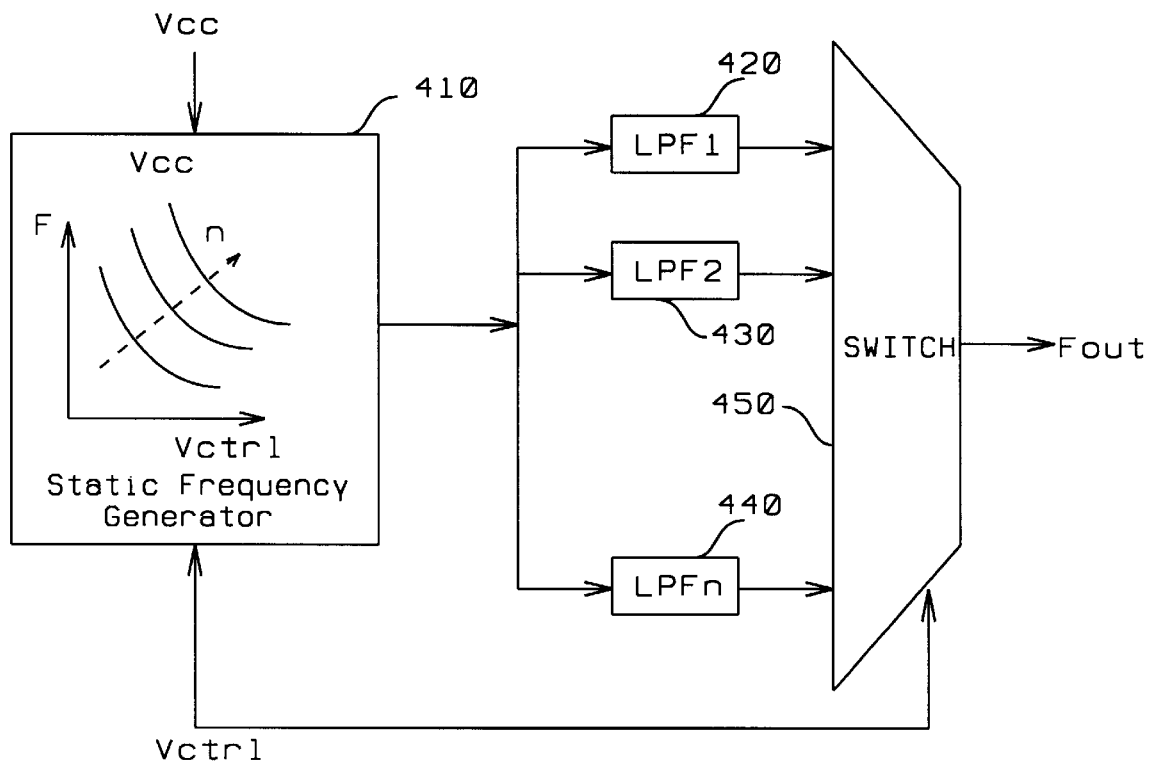
FIG. 4 shows a schematic diagram the PLL structure technique of this invention.

Refer now to the system diagram in FIG. 4 for a discussion of the piecewise linear phase locked loop frequency generator of this invention. The input to the system of FIG. 4 is a control voltage Vctrl of the phase-locked loop. The output of the system is a dynamic frequency Fout. The function of the system is a real-time dynamic frequency Fout generated as a function of the input control voltage Vctrl. The frequency, Fout, vs. control voltage, Vctrl, static frequency generator curves 410 shown in FIG. 4 represent a number (n) of transfer curves.

Figure 5:
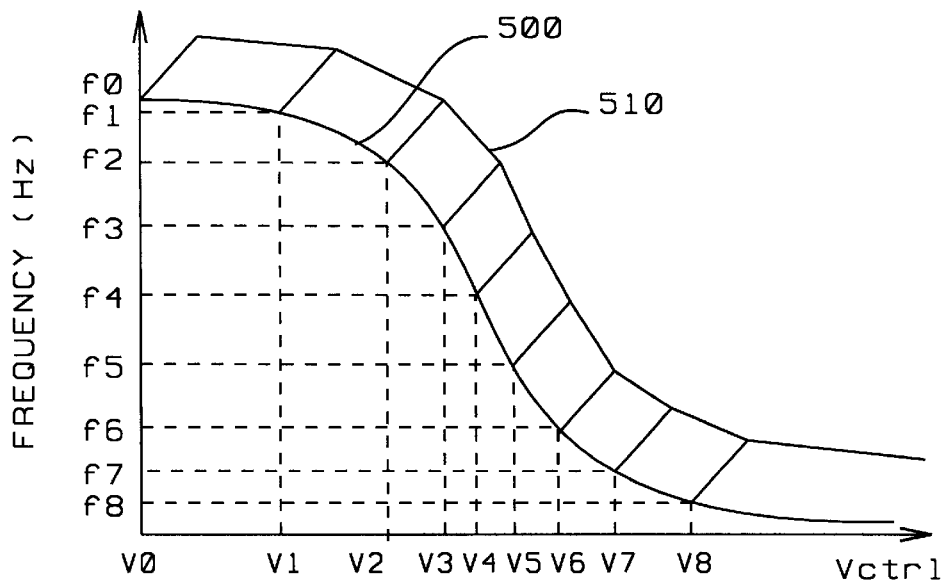
FIG. 5 shows graphically the piece-wise linear PLL simulation method of this invention.
Figure 6:
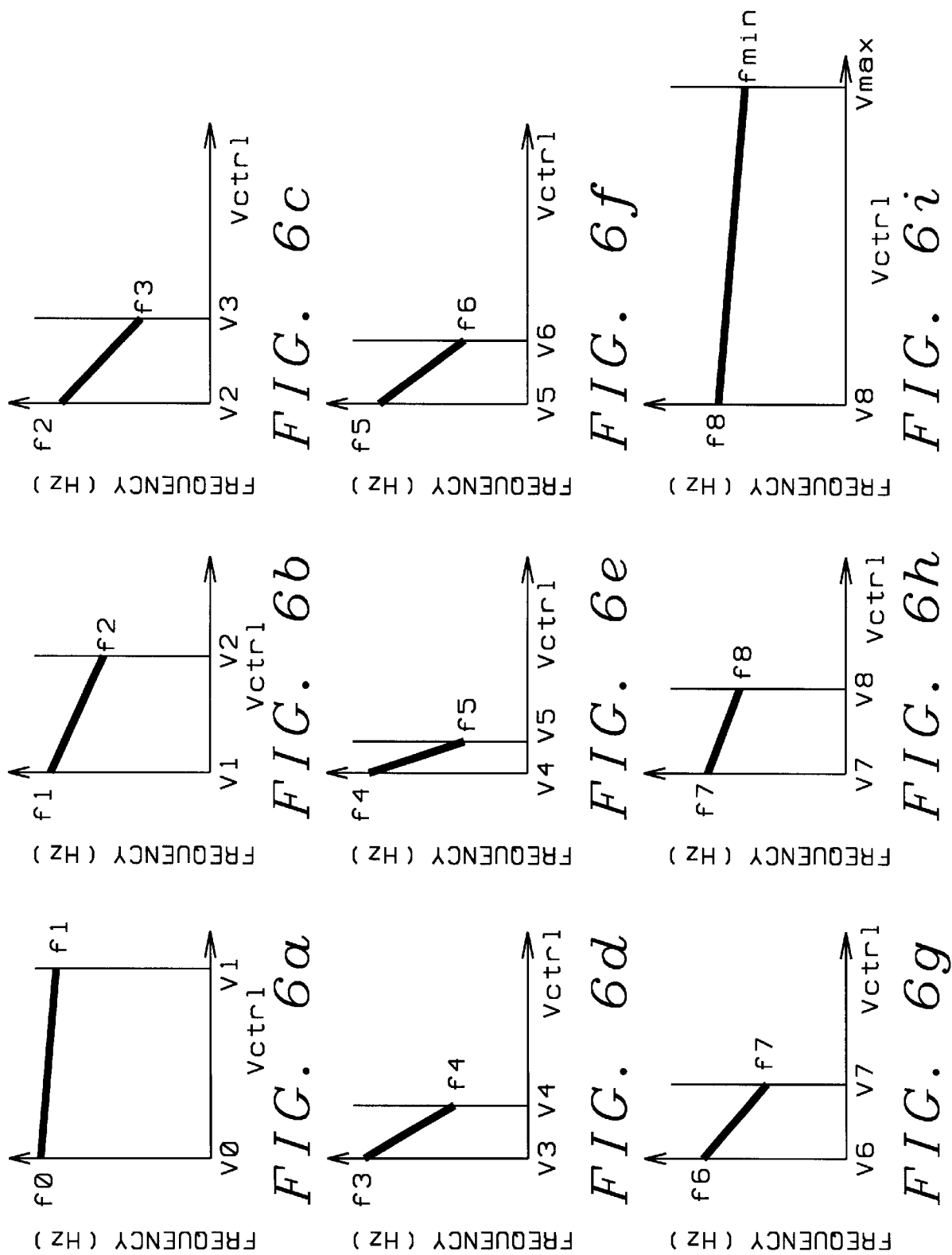
FIGS. 6a–6i shows the individual frequency vs. voltage graphs obtained from the piece-wise approximation of FIG. 5.
Figure 7:
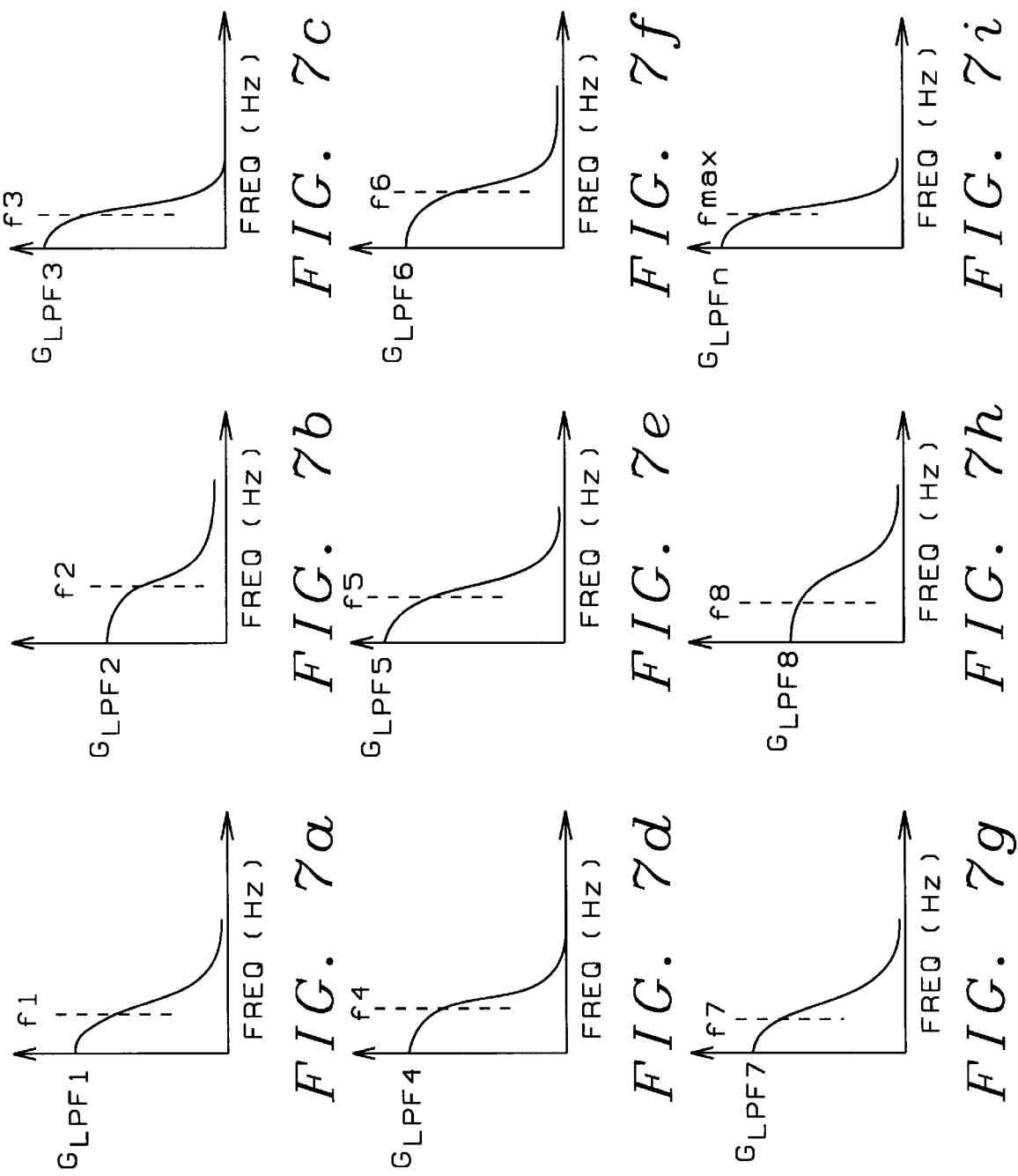
FIGS. 7a–7i shows the individual gain vs. frequency graphs for frequencies sampled in FIG. 5.

The static frequency generator 410 produces a static frequency Fs as a function dependent on the control voltage Vctrl. The control voltage Vctrl is the output voltage of the loop filter 150 of FIG. 1 as described above. The static frequency generator 410 contains a set of arithmetic descriptions. Each arithmetic description provides an algebraic function that describes a section of the VCO transfer curve of FIG. 2. Refer to FIG. 5 for the construction of the algebraic descriptions. FIG. 5 illustrates a VCO transfer curve 500. In the preferred embodiment of this invention, the VCO transfer curve 500 is divided into multiple segments. An algebraic function of the form:

$$f(x)=mx+b \qquad \text{Eq.1}$$

is fitted to each segment of the VCO transferee curve 500. The segments as fitted to Eq. 1 each form a straight line as shown in the piecewise approximation 510 to the VCO transfer curve. The number of straight line segments of the piecewise approximation 510 determines the accuracy of the piecewise approximation versus the actual VCO transfer curve.

The algebraic parameters, in this case, slope m and zero crossing b, are determined for each segment and retained within the static frequency generator. Referring to FIGS. 6a–6i, the slope m and zero crossing b are determined using well understood classic algebraic methods for each segment. Each of the FIGS. 6a–6i shows the function of the static frequency Fs vs. the control voltage Vctrl for each segment of the piecewise approximation 510 of FIG. 5. The static frequency generator 410 of FIG. 4 retains each of the segment functions of FIGS. 6a–6i.

A number of techniques are possible for retaining the functions for each segment within the static frequency generator. Table 1 tabulates the control voltage Vctrl and the corresponding static frequency Fs. The magnitude of the input control voltage Vctrl is determined. The region into which the input control voltage Vctrl falls is determined. The static frequency Fs is then determined by interpolating between the two boundaries of the region.

Alternately, the static frequency generator 410 contains Table 2 containing the slope m and zero crossing b for each segment as shown in FIGS. 6a–6i. In this instance the magnitude of the input control voltage Vctrl is used to point to a range within the table and the static frequency Fs is determined according to Eq. 1.

TABLE 1

| Vctrl | Fs |
|---|---|
| V0 | F0 |
| V1 | F1 |
| V2 | F2 |
| | |
| Vmax | F8 |

TABLE 2

| RANGE Vctrl | m | b |
|---|---|---|
| V0–V1 | m1 | b1 |
| V1–V2 | m2 | b2 |
| V2–V3 | m3 | b3 |
| \| | \| | \| |
| Vn-1–Vn | mn | bn |

Referring back to FIG. 4, the output of the static frequency generator Fs is the input to multiple low pass filters LPF1 420, LPF2 430, . . . LPFn 440. The low pass filters LPF1 420, LPF2 430, . . . LPFn 440 are uniquely designed to have cutoff frequencies that match the upper frequencies of each piecewise segment of segment 510 of FIG. 5.

The output of each low pass filter LPF1 420, LPF2 430, . . . LPFn 440 is connected to an input of the switch 450. The magnitude of the control voltage Vctrl is used to determine which output of the low pass filters LPF1 420, LPF2 430, . . . LPFn 440 are to be transferred through the switch 450 to form the dynamic frequency Fout at the output of the piecewise linear phase locked loop frequency generator of this invention.

The static frequency generator is implemented as a lookup table structured after either Table 1 or Table 2 above. An input variable to the static frequency generator is the magnitude of the control voltage Vctrl. The appropriate segment of the piecewise linear approximation of the VCO transfer curve is determined by the magnitude of the control voltage Vctrl. From the function of the appropriate segment, the static frequency Fs is calculated as described above.

Figure 9:
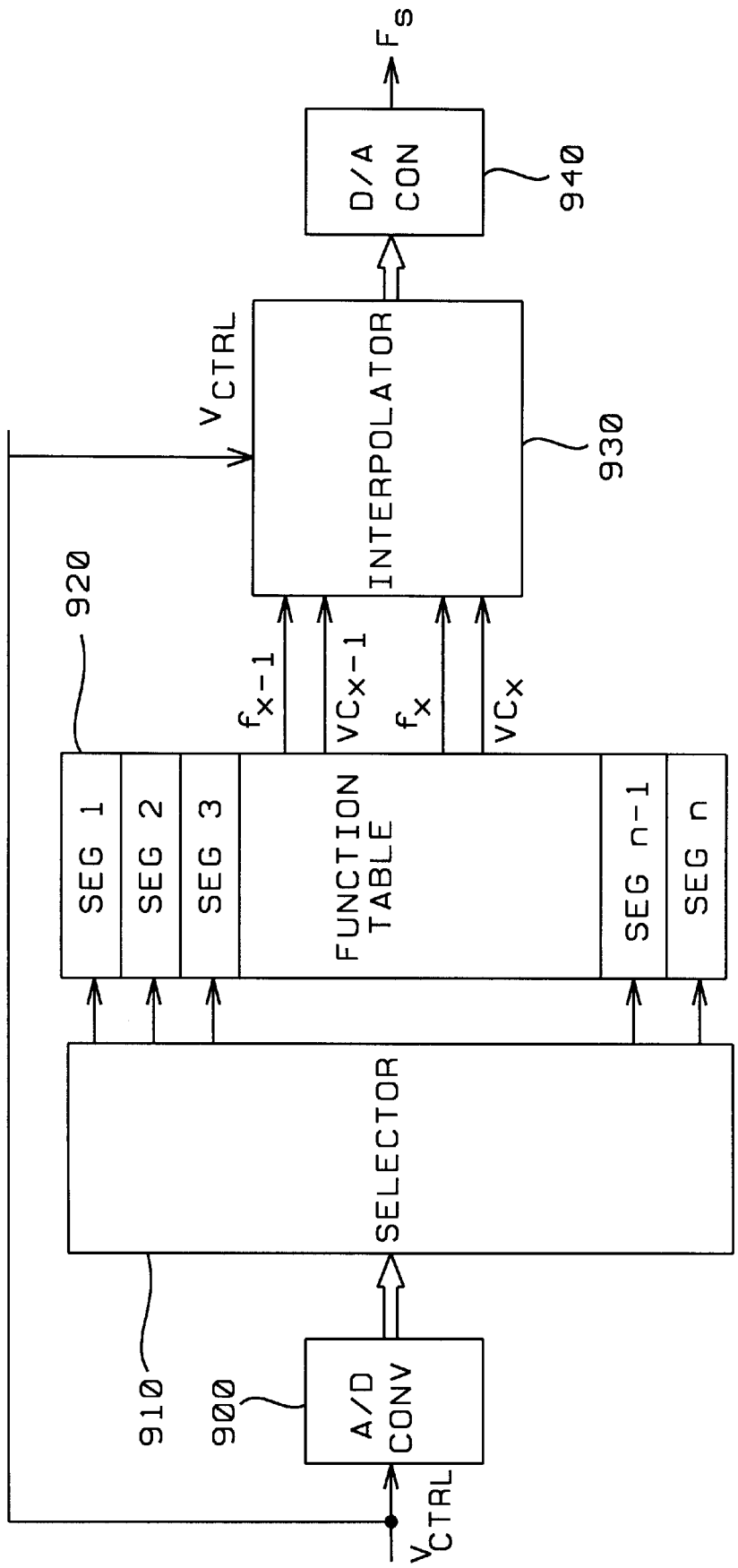
FIG. 9 is a block diagram of an implementation of the static frequency generator using the interpolation approximation.

FIG. 9 is a block diagram for an implementation of the static frequency generator 410 of FIG. 4. FIG. 9 implements the static frequency generator function using the method as described above for Table 1, where the frequency Fs for a control voltage range (Vctrl) is obtained by interpolating the frequency at the endpoints of the range. In FIG. 9, the analog control voltage Vctrl goes into the analog-to-digital converter 900 and comes out as a digital coded signal. The digital signal goes into selector 910 where a piecewise segment of the frequency vs. control voltage curve is selected based on the control voltage endpoints listed in Table 1. Each piecewise segment is assigned a word or address in a function table implemented in a memory circuit 920. When the appropriate memory word in the function table 920 is selected, the output of the memory word which includes the digital coding of the frequency and control voltage of the two endpoints of the selected piecewise segment is sent to the interpolator 930. The interpolator 930 finds the middle or average value of frequency between the given endpoint frequencies. The digital representation of the interpolated frequency result is then sent to the digital-to-analog converter 940 where the digital frequency coding is converted to an analog frequency Fs.

Figure 10:
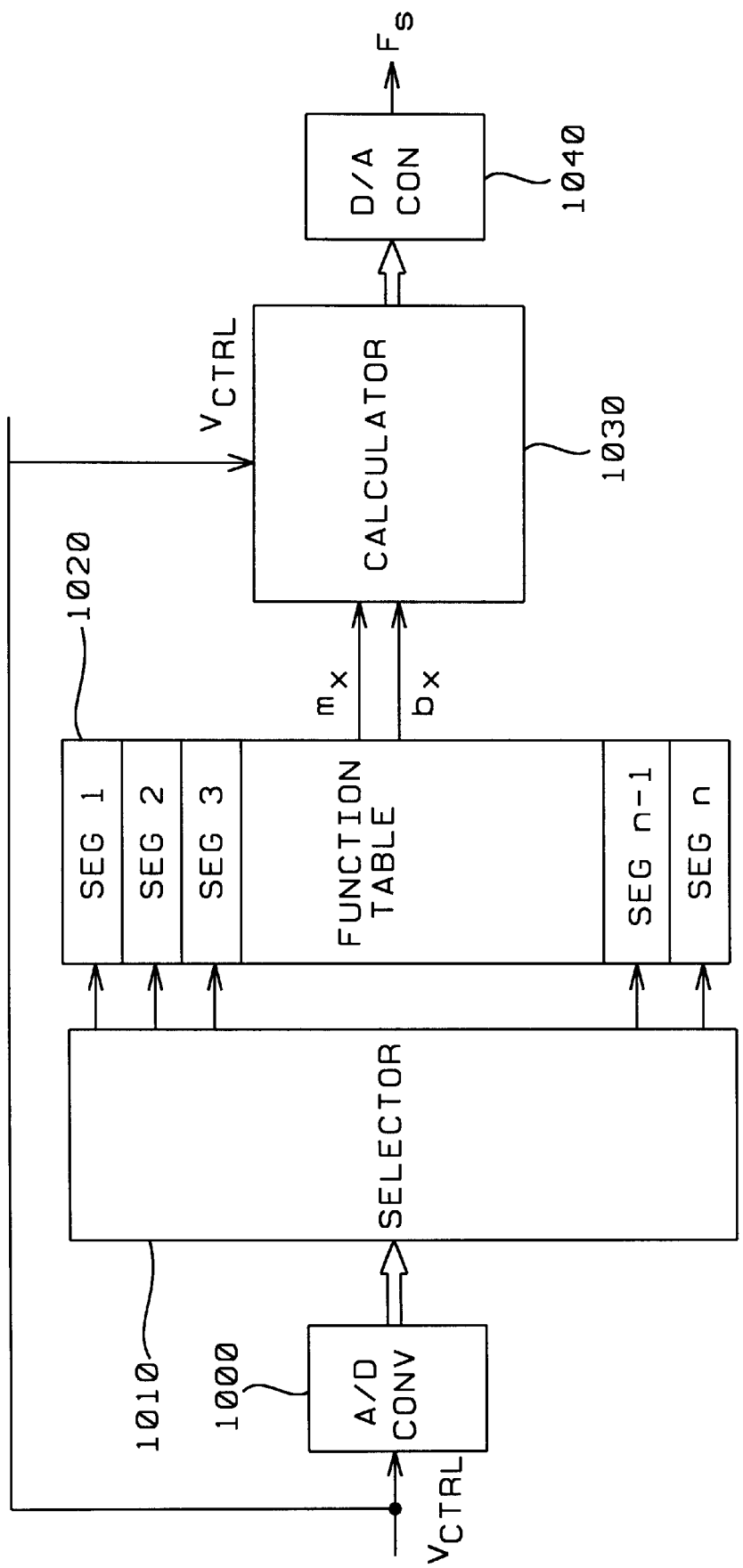
FIG. 10 is a block diagram of an implementation of the static frequency generator using the slope/intercept approximation.

FIG. 10 is a block diagram of a second implementation of the static frequency generator 410 of FIG. 4 using the method as described above for table 2. The frequency Fs for a control voltage range (Vctrl) is obtained by piecewise approximations of the Frequency vs. Control Voltage curves. The slope & y-intercept method of Table 2 is used. In FIG. 10, the analog control voltage Vctrl goes into the analog-to-digital converter 1000 and comes out as a digital coded signal. The digital signal goes into selector 1010 where a piecewise segment of the frequency vs. control voltage curve is selected based on the slope and intercept points listed in Table 2. Each piecewise segment is assigned a word or address in a function table implemented in a memory circuit 1020. When the appropriate memory word in the function table 1020 is selected, the output of the memory word which includes the digital coding of the frequency and control voltage of the slope and intercept of the selected piecewise segment is sent to the calculator 1030. The calculator 1030 generates straight line approximation for the piecewise segment using a function of the form f(x)=mx+b. The digital representation of the approximated frequency result is then sent to the digital-to-analog converter 1040 where the digital frequency coding is converted to an analog frequency Fs.

The piecewise linear phase locked loop frequency generator of FIG. 4 can be built as a hardware simulator of a PLL. In addition, the system can be used to construct a behavioral model of a PLL in a software simulation program executed on a digital computing system. The use of single pole low pass filter RC network representations of piecewise linear sections of the curve in FIG. 5 is an important item of this invention. FIGS. 7a–7i represent nine low-pass filter approximations for the nine frequency samples shown in FIG. 5. The gain labeled on the nine figures in FIG. 7a–7i are obtained from curve fitting the samples in FIG. 5. The use of a switch to select from a bank of n low pass filters allows the complex PLL to be simulated using standard mixed signal simulation models/programs such as VHDL-AMS and Verilog-AMS. These simulators support multi-level and mixed signal simulation. The outputs of the low pass filter 420, 430, 440 are the inputs to the switch 450. The calculated static frequency Fs is the input variable to the low pass filters 420, 430, 440. The low pass filters 420, 430, 440 of FIG. 4 are modeled using Laplace transform filters. The pole position of each filter is found using Spice computer aided circuit analysis. The use of the standard mixed simulation programs with the piecewise linear representation of the PLL results in accurate results for PLL outputs and locking time with far fewer simulation cycles than an exhaustive Spice circuit level simulation of the PLL circuitry.

Figure 8:
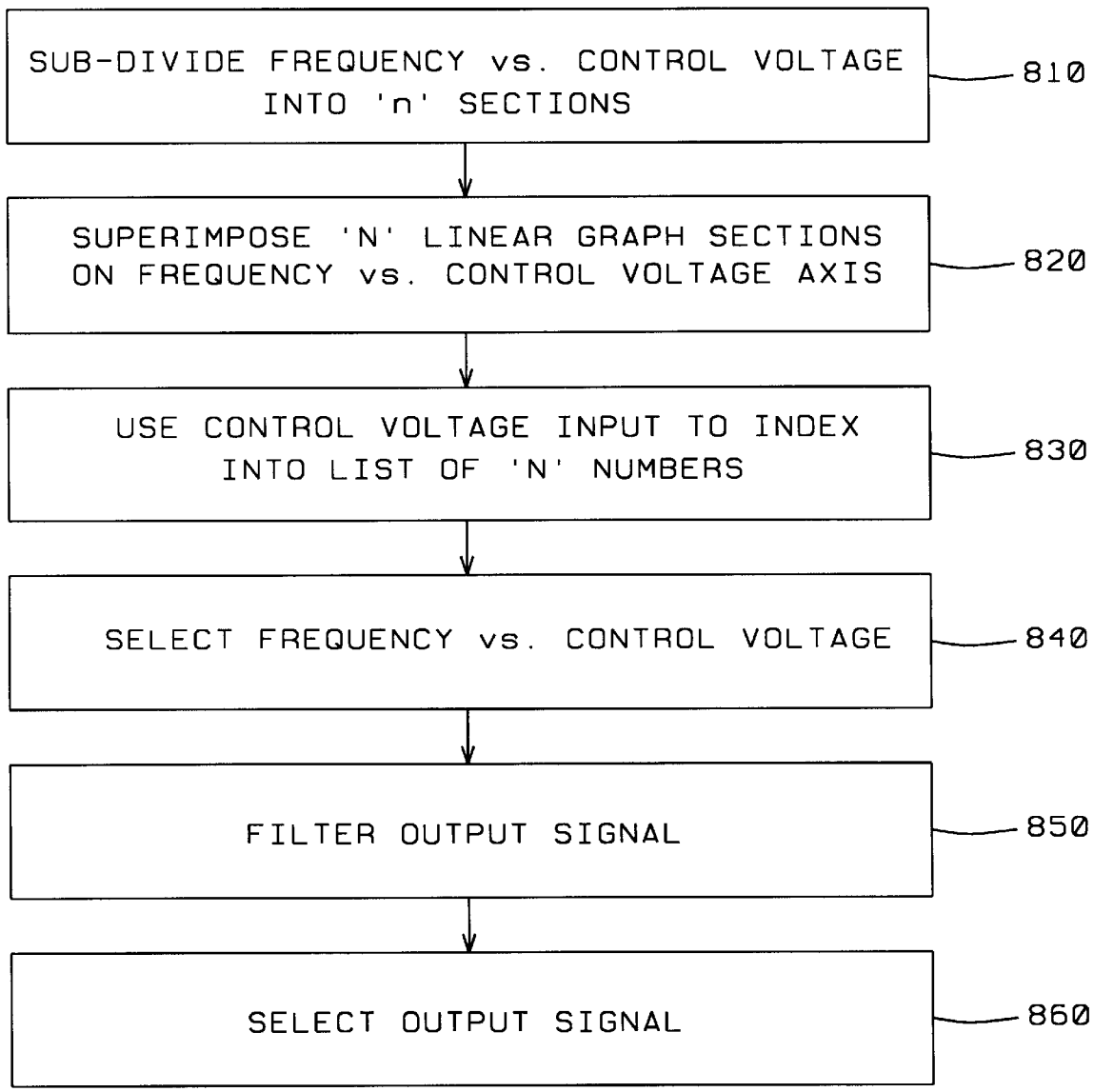
FIG. 8 is a flowchart for the method for behaviorally simulating a phase-locked loop of this invention.

FIG. 8 shows a method diagram for the simulation of a phase-locked loop. The frequency vs. control voltage curve of FIG. 5 is sub-divided 810 into n piecewise linear sections. Next, these n piecewise linear curve sections are compiled 820 into n frequency vs. control voltage curves. The control voltage Vctrl input is used index to 830 into a table of control voltage Vctrl vs. n. The number, n selected by the table is used to select 840 the corresponding Output frequency vs. Control voltage graph. The output of the graph section 840 is filtered by a bank of low pass filters, 850. The output of the appropriate low pass filter is selected 860 by the same number, n, indexed by the control voltage Vctrl input above.

The invention claimed is:

1. A piecewise linear phase locked loop frequency generator to generate a voltage signal controlled by an input voltage comprising:

a variable static frequency generator connected to receive a control voltage to select a frequency transfer curve from a plurality of transfer curves to create a static output frequency, whereby the frequency range of the phase locked loop is divided into a plurality of sections, such the once an appropriate one of the plurality of transfer curves is selected, the output frequency is determined as a function of said control voltage;

a plurality of low pass filters, each having inputs connected to the variable static frequency generator to filter any higher frequency component from the variable static frequency generator; and a selector switch connected to each output of the low pass filters, and connected to receive said control voltage to determine which of the plurality of low pass filters is to filter the output frequency from the variable static frequency generator.

2. The piecewise linear phase locked loop frequency generator of claim 1 wherein the variable static frequency generator comprises:
   a transfer curve retention device to retain a description of said transfer curves;
   a curve selector connected to the transfer curve retention device and to connected to receive said control voltage to determine which of the plurality of transfer curves are to determine the output frequency of said variable static frequency generator as the function of the control voltage; and
   an output frequency generator to generate the output frequency of the variable static frequency generator from the appropriate transfer curve.

3. A piecewise linear phase locked loop frequency generator of claim 1 wherein the low pass filters are Laplace descriptions retained from computer aided circuit analysis.

4. A piecewise linear phase locked loop frequency generator of claim 1 further comprising a filter selector connected to the plurality of low pass filters to select one of the plurality of low pass filters as a function of control voltage whereby each low pass filter is selected by an assigned control voltage.

5. A model of a phase locked loop to be simulated within a simulator to determine the function of said phase locked loop within an electronic system comprising
   a behavioral model of a variable static frequency generator connected to receive a control voltage to select a frequency transfer curve from a plurality of transfer curves to create a static output frequency, whereby the frequency range of the phase locked loop is divided into a plurality of sections, such the once an appropriate one of the plurality of transfer curves is selected, the output frequency is determined as a function of said control voltage;
   a plurality of low pass filters, each having inputs connected to the variable static frequency generator to filter any higher frequency component from the variable static frequency generator; and
   a behavioral model of a selector switch connected to each output of the low pass filters, and connected to receive said control voltage to determine which of the plurality of low pass filters is to filter the output frequency from the variable static frequency generator.

6. The model of a phase locked loop of claim 5 wherein the variable static frequency generator comprises:
   a transfer curve retention device to retain a description of said transfer curves;
   a curve selector connected to the transfer curve retention device and to connected to receive said control voltage to determine which of the plurality of transfer curves are to determine the output frequency of said variable static frequency generator as the function of the control voltage; and
   an output frequency generator to generate the output frequency of the variable static frequency generator from the appropriate transfer curve.

7. The model of a phase locked loop of claim 5 wherein the low pass filters are Laplace descriptions retained from computer aided circuit analysis.

8. A method for simulating a model of a phase locked loop to be simulated within a simulator to determine the function of said phase locked loop within an electronic system comprising the steps of:
   generating a static frequency from a plurality of piece wise linear approximations of control voltage versus static output frequency transfer characteristic curve of a voltage controlled oscillator as a function of said control voltage;
   filtering with a bank of a plurality of low pass filters said static output frequency; and
   selecting an appropriate low pass filter as a function of the control voltage to create an output put frequency determined by said control voltage.

9. A method for simulating a model of a phase locked loop of claim 8 wherein generating a static frequency comprises the steps of:
   dividing said control voltage versus static output frequency transfer characteristic curve of the voltage controlled oscillator into piecewise linear sections;
   compiling said piece wise linear sections into table containing the plurality of piece wise linear approximations;
   receiving a control voltage input to said voltage controlled oscillator
   selecting as a function of said control voltage an appropriate frequency vs. control voltage curve of the plurality of frequency vs. control voltage curves; and
   determining from the appropriate frequency vs. control voltage curve a static output frequency for said voltage controlled oscillator.

10. A method for simulating a model of a phase locked loop of claim 8 wherein the plurality of low pass filters are Laplace descriptions retained from computer aided circuit analysis.

11. A system for simulating a model of a phase locked loop to be simulated within a simulator to determine the function of said phase locked loop within an electronic system comprising:
   a variable static frequency generator connected to receive a control voltage to select a frequency transfer curve from a plurality of transfer curves to create a static output frequency, whereby the frequency range of the phase locked loop is divided into a plurality of sections, such the once an appropriate one of the plurality of transfer curves is selected, the output frequency is determined as a function of said control voltage;
   a plurality of low pass filters, each having inputs connected to the variable static frequency generator to filter any higher frequency component from the variable static frequency generator; and
   a selector switch connected to each output of the low pass filters, and connected to receive said control voltage to determine which of the plurality of low pass filters is to filter the output frequency from the variable static frequency generator.

12. A system for simulating a model of a phase locked loop of claim 11 wherein the variable static frequency generator comprises:
   a transfer curve retention device to retain a description of said transfer curves;
   a curve selector connected to the transfer curve retention device and to connected to receive said control voltage to determine which of the plurality of transfer curves are to determine the output frequency of said variable static frequency generator as the function of the control voltage; and
   an output frequency generator to generate the output frequency of the variable static frequency generator from the appropriate transfer curve.

13. A system for simulating a model of a phase locked loop of claim 11 wherein the low pass filters are Laplace descriptions retained from computer aided circuit analysis.

14. An apparatus for simulating a model of a phase locked loop to be simulated within a simulator to determine the function of said phase locked loop within an electronic system comprising:

means for generating a static frequency from a plurality of piece wise linear approximations of control voltage versus static output frequency transfer characteristic curve of a voltage controlled oscillator as a function of said control voltage;

means for filtering with a bank of a plurality of low pass filters said static output frequency; and means for selecting an appropriate low pass filter as a function of the control voltage to create an output put frequency determined by said control voltage.

15. An apparatus for simulating a model of a phase locked loop of claim 14 wherein generating a static frequency comprises the steps of:

dividing said control voltage versus static output frequency transfer characteristic curve of the voltage controlled oscillator into piecewise linear sections;

compiling said piece wise linear sections into table containing the plurality of piece wise linear approximations;

receiving a control voltage input to said voltage controlled oscillator selecting as a function of said control voltage an appropriate frequency vs. control voltage curve of the plurality of frequency vs. control voltage curves; and determining from the appropriate frequency vs. control voltage curve a static output frequency for said voltage controlled oscillator.

16. An apparatus for simulating a model of a phase locked loop of claim 14 wherein the plurality of low pass filters are Laplace descriptions retained from computer aided circuit analysis.

17. A program retention device containing program instruction code executable on at least one networked computing device for simulating a model of a phase locked loop to be simulated within a simulator to determine the function of said phase locked loop within an electronic system, whereby said program performs the steps of:

generating a static frequency from a plurality of piece wise linear approximations of control voltage versus static output frequency transfer characteristic curve of a voltage controlled oscillator as a function of said control voltage;

filtering with a bank of a plurality of low pass filters said static output frequency; and selecting an appropriate low pass filter as a function of the control voltage to create an output put frequency determined by said control voltage.

18. A program retention device containing program instruction code executable on at least one networked computing device for simulating a model of a phase locked loop of claim 17 wherein generating a static frequency comprises the steps of:

dividing said control voltage versus static output frequency transfer characteristic curve of the voltage controlled oscillator into piecewise linear sections;

compiling said piece wise linear sections into table containing the plurality of piece wise linear approximations;

receiving a control voltage input to said voltage controlled oscillator selecting as a function of said control voltage an appropriate frequency vs. control voltage curve of the plurality of frequency vs. control voltage curves; and determining from the appropriate frequency vs. control voltage curve a static output frequency for said voltage controlled oscillator.

19. A program retention device containing program instruction code executable on at least one networked computing device for simulating a model of a phase locked loop of claim 17 wherein the plurality of low pass filters are Laplace descriptions retained from computer aided circuit analysis.

* * * * *